(12) United States Patent
Nishide et al.

(10) Patent No.: US 6,468,640 B2
(45) Date of Patent: Oct. 22, 2002

(54) MONOLITHIC CERAMIC SUBSTRATE, MANUFACTURING AND DESIGNING METHODS THEREFOR, AND ELECTRONIC DEVICE

(75) Inventors: Mitsuyoshi Nishide, Shiga-ken; Norio Sakai, Moriyama; Akira Baba, Omihachiman, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/828,080

(22) Filed: Apr. 6, 2001

(65) Prior Publication Data

US 2002/0058131 A1 May 16, 2002

(30) Foreign Application Priority Data

Apr. 10, 2000 (JP) ........................................ 2000-107797

(51) Int. Cl.⁷ ................................................ B32B 3/00
(52) U.S. Cl. ........................ 428/210; 428/209; 428/212; 428/213; 428/214; 174/255; 174/259; 361/795
(58) Field of Search ................................ 428/210, 212, 428/213, 214, 209; 174/255, 258, 259; 361/795

(56) References Cited

U.S. PATENT DOCUMENTS 5,495,394 A * 2/1996 Kornfeld et al. ............... 439/66
5,840,382 A * 11/1998 Nishide et al. ................ 428/209
6,036,798 A * 3/2000 Nishide et al. .............. 156/89.12
6,337,123 B1 * 1/2002 Ryugo et al. ................. 428/210

FOREIGN PATENT DOCUMENTS

| EP | 0570855 A2 | 11/1993 |
| EP | 1096558 A2 | 5/2001 |
| JP | 050051264 | 8/1991 |
| JP | 070330445 | 6/1994 |
| JP | 11-354376 | 12/1999 |

* cited by examiner

*Primary Examiner*—Cathy Lam
(74) *Attorney, Agent, or Firm*—Keating & Bennett, LLP

(57) ABSTRACT

In a green laminate body including a plurality of base green layers and a plurality of constraining green layers for forming a monolithic ceramic substrate by using a non-shrinking process, when the thicknesses of the base green layers differ from each other, a thicker base green layer shrinks largely during sintering, and hence, the resulting monolithic ceramic substrate may warp in some cases. In order to solve this problem, the constraining green layers, which are in contact with the main surfaces of the individual base green layers, have different thicknesses so that a relatively thicker constraining green layer is in contact with a relatively thicker base green layer, and a relatively thinner constraining green layer is in contact with a relatively thinner base green.

7 Claims, 4 Drawing Sheets

MONOLITHIC CERAMIC SUBSTRATE, MANUFACTURING AND DESIGNING METHODS THEREFOR, AND ELECTRONIC DEVICE

BACKGROUND OF THE INVENTION

1. Field of the Invention

The present invention relates to monolithic ceramic substrates, to manufacturing and designing methods therefor, and to electronic devices including such a monolithic ceramic substrate. In particular, the present invention relates to an improvement for reducing warpage of the monolithic ceramic substrate.

2. Description of the Related Art

Monolithic ceramic substrates include a plurality of ceramic layers laminated together to define a laminate body. In the monolithic ceramic substrate having the structure described above, various wiring conductors are provided. As wiring conductors, for example, internal conductive films extending along predetermined interfaces between ceramic layers and via hole conductors extending so as to penetrate predetermined ceramic layers are provided inside a monolithic ceramic substrate, and external conductive films are arranged to extend on the external surfaces of the monolithic ceramic substrate.

Monolithic ceramic substrates are used for mounting semiconductor chip units, other chip units, and other electronic components, and are used for interconnection of these electronic units. The wiring conductors described above define electric pathways for the interconnection described above.

In addition, passive units, such as capacitors, and inductors, may be embedded in monolithic ceramic substrates in some cases. In the case described above, these passive units are defined by parts of the internal conductive films and the via hole conductors used as the wiring conductors described above.

Monolithic ceramic substrates are used for, for example, LCR hybrid high frequency components in the field of terminal apparatuses for mobile communication. In addition, in the field of computers, monolithic ceramic substrates are used for forming hybrid components including active units, such as semiconductor integrated circuit (IC) chips, and passive units, such as capacitors, inductors, and resistors, or are used for merely forming semiconductor IC packages.

In particular, laminated ceramic electronic components are widely used for constituting various electronic devices, such as PA module substrates, RF diode switches, filters, chip antennas, various package devices, and hybrid devices.

In order to improve the multi-functionality, mounting densities, and performances of the monolithic ceramic substrates, it is effective to form wiring conductors having finer pattern densities.

However, in order to form a monolithic ceramic substrate, a sintering step must be performed. In the sintering step mentioned above, sintering of the ceramic causes shrinkage, and the shrinkage does not occur uniformly over the entire monolithic ceramic substrate, whereby undesired deformation and warping of the wiring conductors may be generated. The deformation and warping of the wiring conductors interfere with the improvement in wiring density of the wiring conductor.

Accordingly, a so-called non-shrinking process is proposed for use in manufacturing of monolithic ceramic substrates, in which the shrinkage of the monolithic ceramic substrate in the direction along the main surface can be substantially constrained during a sintering step.

In a method for manufacturing monolithic ceramic substrates in accordance with the non-shrinking process, in addition to a low-temperature sinterable ceramic material which can be sintered at, for example, 1,000° C. or less, an inorganic particle is prepared which constrains the shrinkage and which is not sintered at a sintering temperature of the low-temperature sinterable material described above. When a green laminate is prepared which forms a predetermined monolithic ceramic substrate by sintering, constraining green layers containing the inorganic particle are disposed so as to be in contact with the main surfaces of predetermined layers of a plurality of base green layers which are laminated with each other and which contain the low-temperature sinterable ceramic material. In addition, conductive paste bodies for forming wiring conductors are provided for the base green layers.

The green laminate thus obtained is then fired. During this sintering step, reaction layers having a thickness of approximately about 2 µm to about 3 µm are formed at the interfaces between the base green layers and the constraining green layers, and the reaction layer adheres the base green layer to the constraining layer adjacent thereto. In addition, since the inorganic powder material contained in the constraining green layers is not substantially sintered, substantial shrinkage is unlikely to occur in the constraining green layers. Accordingly, since the constraining green layers constrain the shrinkage of the base green layers, the base green layers substantially shrink only in the thickness directions thereof, and the shrinkage in the directions along the main surfaces is constrained. As a result, since irregular deformation is difficult to occur in the monolithic ceramic substrate formed by sintering the green laminate, unwanted deformation and warping hardly occur, whereby a higher pattern densities of the wiring conductors can be achieved.

However, even though the shrinkage of the base green layer can be constrained in the direction along the main surface thereof, the shrinkage cannot be reduced to 0%, and since binders are lost which are contained in the base green layer and the constraining green layer, shrinkage of at least 2 to 3% inevitably occurs.

In addition, the shrinkage described above varies in accordance with the characteristics of the base green layer and the constraining green layer. For example, when the thickness of the base green layer is increased, it becomes difficult for the constraining force of the constraining green layer to work on the base green layers, and as a result, the base green layer is more likely to shrink. Furthermore, the thinner the constraining green layer, the weaker the constraining force for constraining the shrinkage. Consequently, the base green layer is more likely to shrink.

Accordingly, in a green laminate including a plurality of types of base green layers having different thicknesses in the range of, for example, 25 µm to 300 µm, in the case in which constraining green layers having the same characteristic are formed so as to be in contact with the main surfaces of the base green layers, the shrinking rates thereof may vary in the lamination direction of the laminate body when a monolithic ceramic substrate is formed by sintering the green laminate, and as a result, the laminate body may be warped. Furthermore, in a serious case, cracking and separation may occur in the laminate body. Consequently, the accuracy of positions at which the wiring conductors are provided for the laminate body is degraded, whereby formation of the wiring conductors having finer wiring density is prevented, and hence, reliability of the monolithic ceramic substrate thus obtained is decreased.

In the description of the related art above, the difference in thickness of the base green layers is exemplarily described as a factor which causes differences in the shrinking rates of the green layers. However, in addition the difference in thickness, the shrinking rates of the base green layers may differ from each other due to the difference in composition or type of material constituting the base green layers, the difference in wiring density distribution or distribution of the wiring conductors provided for the base green layers, or other factors.

SUMMARY OF THE INVENTION

In order to overcome the problems described above, preferred embodiments of the present invention provide a greatly improved monolithic ceramic substrate, manufacturing and designing methods therefor, and an electronic device including the novel monolithic ceramic substrate described above.

According to a preferred embodiment of the present invention, a monolithic ceramic substrate formed by sintering a green laminate includes a plurality of base ceramic layers which contain a low-temperature sinterable ceramic material and which are laminated with each other, a plurality of constraining layers which contain inorganic particles not sintered at a sintering temperature of the low-temperature sinterable ceramic material and which are each disposed so as to be in contact with the main surface of a predetermined layer of the plurality of base ceramic layers, the inorganic particles being bonded by diffusion of a part of the low-temperature sinterable ceramic material contained in the base ceramic layer adjacent to the constraining layer, and wiring conductors provided for the base ceramic layers.

In the monolithic ceramic substrate described above, in order to solve the problems described above, at least two constraining layers selected from the plurality of constraining layers have different constraining forces which are applied to base green layers for defining the base ceramic layers to constrain the shrinkage thereof during a sintering step.

In the monolithic ceramic substrate described above, it is preferable that the base ceramic layers include a relatively thick first base ceramic layer and a relatively thin second base ceramic layer, and the constraining layers include a first constraining layer disposed so as to be in contact with the main surface of the first base ceramic layer and a second constraining layer disposed so as to be in contact with the main surface of the second base layer, in which the thickness of the first constraining layer is larger than that of the second constraining layer.

In the monolithic ceramic substrate including a first and second base ceramic layer and a first and second constraining layer, described above, the particle diameter of the inorganic particles contained in the first constraining layer is preferably smaller than that of the inorganic particles contained in the second constraining layer.

In the monolithic ceramic substrate described above, it is preferable that the base ceramic layers include a first and second base ceramic layer having different thicknesses, and the constraining layers include a first and second constraining layer disposed so as to be in contact with the main surfaces of the first and the second base ceramic layers, respectively, in which the types of the inorganic particles contained in the first and the second constraining layers differ from each other.

In the monolithic ceramic substrate of various preferred embodiments of the present invention, the wiring conductors are preferably formed of a conductive material primarily composed of at least one metal selected from the group consisting of Ag, Au, Cu, Ni, Ag—Pd, and Ag—Pt.

In addition, in the monolithic ceramic substrate described above, the wiring conductors may have various shapes, and for example, the wiring conductors preferably include a conductive film extending along the main surface of the base ceramic layer and a via hole conductor extending so as to penetrate the base ceramic layer.

According to another preferred embodiment of the present invention, a method for manufacturing a monolithic ceramic substrate includes the steps of forming a green laminate including a plurality of base green layers which contain low-temperature sinterable ceramic particles and which are laminated with each other, a plurality of constraining green layers which contain inorganic particles not sintered at a sintering temperature of the low-temperature sinterable ceramic particles and which are each disposed so as to be in contact with the main surface of a predetermined layer of the plurality of base ceramic layers, and wiring conductors provided for the base green layers, and sintering the green laminate under conditions causing sintering of the low-temperature sinterable ceramic material, wherein at least two base green layers selected from the plurality of base green layers constituting the green laminate have different intrinsic shrinkabilities during the sintering step.

In the method for manufacturing a monolithic ceramic substrate described above, in order to solve the technical problems described above, that is, in order to constrain warping of the laminate caused by the difference between the shrinkabilities during the sintering step, at least two constraining green layers selected from the plurality of constraining green layers constituting the green laminate preferably have different constraining forces applied to the base green layers so as to constrain the shrinkage thereof.

In the method for manufacturing a monolithic ceramic substrate described above, the constraining force of the constraining green layer may be controlled by a factor of, for example, the thickness of the constraining green layer, the particle diameter, the type, the shape, the particle distribution, the content of the inorganic particles contained in the constraining green layer, and the surface condition of the constraining green layer, or may be controlled by a combination thereof.

In the method for manufacturing a monolithic ceramic substrate described above, the first forming step may further include a step of preparing base green sheets for forming the base green layers and a second forming step of forming the constraining green layers on the base green sheets.

In the method for manufacturing a monolithic ceramic substrate described above, the second forming step may further include a step of preparing a slurry to be used for forming the constraining green layers and a step of coating the slurry on the base green sheets, or may further include a step of preparing constraining green sheets for forming the constraining green layers and a step of overlaying the constraining green sheets on the base green sheets.

In the method for manufacturing a monolithic ceramic substrate described above, instead of the steps described above, the first forming step may further include the steps of preparing a base slurry to be used for forming the base green layers, preparing a constraining slurry to be used for forming the constraining green layers, coating the base slurry to form the base green layers, and coating the constraining slurry on the base green layers to form the constraining green layers.

Preferred embodiments of the present invention can also be applied to monolithic ceramic substrates manufactured by the methods described above.

In addition, preferred embodiments of the present invention can also be applied to a method for designing a monolithic ceramic substrate manufactured by the methods described above.

According to yet another preferred embodiment of the present invention, a method for designing a monolithic ceramic substrate includes a first step of sintering a composite formed by laminating a first test green layer containing the low-temperature sinterable ceramic particles and a second test green layer containing the inorganic particles under conditions causing sintering of the low-temperature sinterable ceramic particles to measure the shrinking rate of the first test green layer in the direction along the main surface thereof. In addition, this first step is performed for combinations of a plurality of types of first test green layers having different shrinkabilities from each other during sintering and a plurality of types of second test green layers having different constraining forces from each other during sintering, whereby the shrinking rates of the individual combinations are preliminarily obtained.

In addition, the method for designing a monolithic ceramic substrate described above preferably includes a second step of selecting a plurality of types of first test green layers having characteristics that are substantially equivalent to those of a plurality of base green layers required for forming a monolithic ceramic substrate, a third step of selecting some of the combinations of the first test green layers and the second test green layers, having the shrinking rates approximately equivalent to those of the plurality of selected types of first test green layers, and a fourth step of determining the characteristics of constraining green layers which are substantially equivalent to those of the second test green layers of the selected combinations.

The second step described above may have various modifications in accordance with factors in determining characteristics for selecting the first test green layers.

That is, when the thickness of the first test green layer is the factor, first test green layers may be selected having thicknesses that are substantially equivalent to those of the base green layers.

In addition, when the composition of the first test green layer is the factor, first test green layers may be selected to have compositions that are substantially equivalent to those of the base green layers.

Furthermore, when the wiring conductor provided on the first test green layer is the factor, first test green layers may be selected to have wiring conductors that are substantially equivalent to those provided on the base green layers.

In the method for designing a monolithic ceramic substrate according to preferred embodiments of the present invention, the fourth step described above may have various modifications in accordance with characteristics of constraining green layers to be determined.

That is, when the thickness of the constraining green layer is the characteristic to be determined, constraining green layers may be have thicknesses that are substantially equivalent to those of the second test green layers.

In addition, when the particle diameter of the inorganic particles contained in the constraining green layer is the characteristic to be determined, constraining green layers preferably contain inorganic particles having particle diameters that are substantially equivalent to those of the inorganic particles contained in the second test green layers.

Furthermore, when the type of inorganic particle contained in the constraining green layer is the characteristic to be determined, constraining green layers preferably contain inorganic particles that are substantially equivalent to the types of inorganic particles contained in the second test green layers.

Preferred embodiments of the present invention can also be applied to an electronic device including the monolithic ceramic substrate described above and a motherboard having the monolithic ceramic substrate mounted thereon.

Other features, elements, characteristics and advantages of the present invention will become apparent from the following detailed description of preferred embodiments of the present invention with reference to the attached drawings.

DETAILED DESCRIPTION OF PREFERRED EMBODIMENTS

Figure 1:
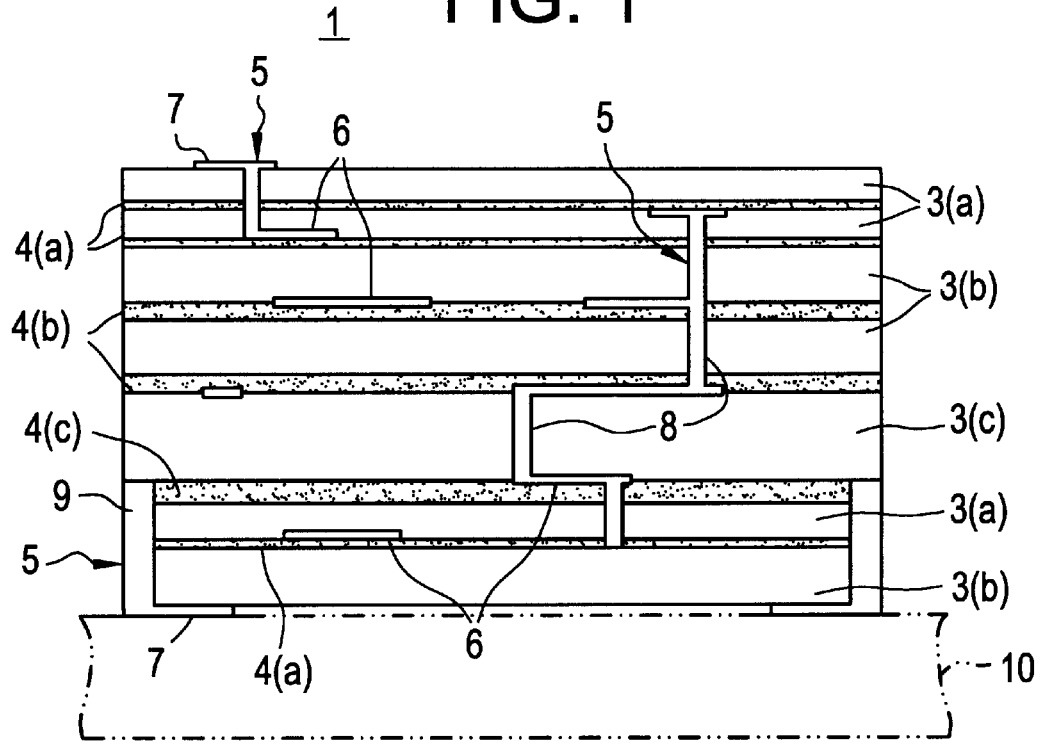
FIG. 1 is a schematic cross-sectional view showing a monolithic ceramic substrate 1 of a preferred embodiment according to the present invention.
Figure 2:
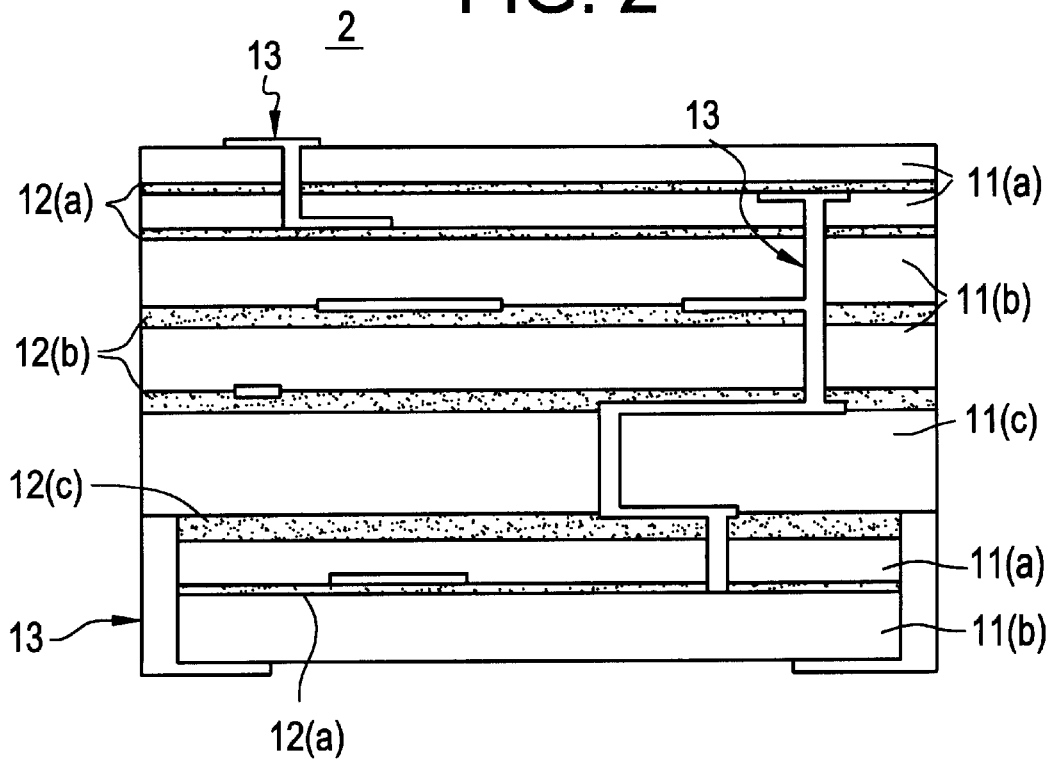
FIG. 2 is a schematic cross-sectional view showing a green laminate 2 for forming the monolithic ceramic substrate 1 shown in FIG. 1.

FIG. 1 is a schematic cross-sectional view of a monolithic ceramic substrate 1 according to a preferred embodiment of the present invention. FIG. 2 is a schematic cross-sectional view of a green laminate body 2 for forming the monolithic ceramic substrate 1 shown in FIG. 1. The monolithic ceramic substrate 1 is preferably formed by sintering the green laminate 2.

As shown in FIG. 1, the monolithic ceramic substrate 1 preferably includes a plurality of base ceramic layers 3 which contain a low-temperature sinterable ceramic material and which are laminated with each other. As the base ceramic layers 3, there are ceramic layers marked by "3(a)", ceramic layers marked by "3(b)", and a ceramic layer marked by "3(c)". These reference numerals "3(a)", "3(b)", and "3(c)" are used when it is necessary to discriminate one from the others.

The monolithic ceramic substrate 1 also preferably includes a plurality of constraining layers 4 which are arranged so as to be in contact with the main surfaces of predetermined layers of the base ceramic layers 3 and which contain an inorganic particle not sintered at a sintering temperature of the low-temperature sinterable ceramic material described above. In addition, the inorganic particle contained in the constraining layer 4 is bonded by diffusion of a part of a material contained in the base ceramic layer 3 adjacent to the constraining layer 4. In this preferred embodiment, the constraining layers 4 are provided along the interfaces of the plurality of base ceramic layers 3. As the constraining layers 4, there are constraining layers marked by "4(a)", constraining layers marked by "4(b)", and a constraining layer marked by "4(c)". The reference numerals "4(a)", "4(b)", and "4(c)" are used when it is necessary to discriminate one from the others.

The monolithic ceramic substrate 1 further includes wiring conductors 5. As the wiring conductors 5, for example, there are conductive films 6 and 7 extending along the main surfaces of the base ceramic layers 3 and via hole conductors 8 and 9 extending so as to penetrate the base ceramic layers 3. As the conductive films 6 and 7, there are internal conductive films 6 provided inside the monolithic ceramic substrate 1 and external conductive films 7 provided on the external surfaces of the monolithic ceramic substrate 1. In addition, the via hole conductors 8 are provided inside the monolithic ceramic substrate 1, and the via hole conductors 9 are terminal via hole conductors 9 exposed at the side surfaces of the monolithic ceramic substrate 1.

The monolithic ceramic substrate 1 is mounted on a mother board 10 shown by a fictitious outline for forming a desired electronic device. In order to mount the monolithic ceramic substrate 1 on the mother board 10, the terminal via hole conductors 9 described above and the external conductive films 7 connected thereto are provided on the mother board 10 by, for example, soldering. In addition, even though not shown in the figure, on the upper surface of the monolithic ceramic substrate 1 shown in the figure, various electronic units may be mounted in some cases.

Concerning the thicknesses of the individual base ceramic layers 3 in the monolithic ceramic substrate 1 described above, the base ceramic layer 3(a) is preferably the thinnest, the base ceramic layer 3(b) has an intermediate thickness, and the base ceramic layer 3(c) is the thickest.

In addition, the thicknesses of the constraining layers 4 differ from each other. That is, the thinnest constraining layer 4(a) is in contact with the thinnest base ceramic layer 3(a), the constraining layer 4(b) having an intermediate thickness is in contact with the base ceramic layer 3(b) having an intermediate thickness, and the thickest constraining layer 4(c) is in contact with the thickest base ceramic layer 3(c).

In order to obtain the monolithic ceramic substrate 1 described above, the green laminate body 2 shown in FIG. 2 is formed.

The green laminate body 2 preferably includes a plurality of base green layers 11 which contain low-temperature sinterable ceramic particles and which are laminated with each other. The base ceramic layers 3 described above are preferably formed by sintering the base green layers 11.

The green laminate body 2 also preferably includes a plurality of constraining green layers 12 which are disposed so as to be in contact with the main surfaces of predetermined layers of the base green layers 11 and which contain inorganic particles not sintered at a sintering temperature of the low-temperature sinterable ceramic material. The constraining layers 4 described above are preferably formed by sintering the constraining green layers 12.

The green laminate 2 further includes conductive paste bodies 13 which are provided for the base green layers 11 and which are used for forming the wiring conductors 5. The conductive paste bodies 13 have portions corresponding to the internal conductive films 6, the external conductive films 7, the via hole conductors 8, and the terminal via hole conductors 9 described above.

The green laminate body 2 described above is fired under conditions causing sintering of the low-temperature sinterable ceramic material, thereby yielding the monolithic ceramic substrate 1.

As the plurality of base green layers 11 forming the green laminate body 2, corresponding to the individual thicknesses of the base ceramic layers 3 described above, there are thinnest base green layers 11(a), base green layers 11(b) having an intermediate thickness, and thickest base green layer 11(c). Due to the difference in thickness described above, degrees of shrinkage-constraint effects differ from each other, which are obtained by shrinkage-constraint actions of the constraining green layers 12. Accordingly, concerning the intrinsic shrinkabilities of the base green layers 11 during a sintering step, the thickest base green layer 11(a) has the highest ability, and the thinnest base green layer 11(c) has the lowest ability.

In the structure described above, when no measure is taken, warping of the laminate 2 may occur during a sintering step due to the difference in shrinkability as described above. In order to prevent the occurrence of the warping, the constraining green layers 12 are used having different constraining forces applied to the base green layers 11 for constraining the shrinkage thereof.

That is, the constraining green layer 12(a), which is arranged so as to be in contact with the main surface of the thinnest base green layer 11(a) having the lowest shrinkability, is formed to be the thinnest layer, that is, the constraining green layer 12(a) is formed to have the weakest constraining force.

The constraining green layer 12(b), which is arranged to be in contact with the main surface of the base green layer 11(b) having an intermediate thickness, i.e., having an intermediate shrinkability, is formed to have an intermediate thickness, that is, the constraining green layer 12(b) is formed to have an intermediate constraining force.

The constraining green layer 12(c), which is arranged so as to be in contact with the main surface of the thickest base green layer 11(c) having the highest shrinkability, is formed to be the thickest layer, that is, the constraining layer 12(c) is formed to have the strongest constraining force.

In order to form the green laminate body 2 described above, the method described below is preferably used.

The base green sheets are first prepared for forming the base green layers 11. The base green sheets contain ceramic particles sinterable at, for example, approximately 1,000° C. or less. In particular, for example, the base green sheets are preferably formed in a manner described below.

That is, a plasticizer and an organic vehicle including an organic binder and a solvent are added to the low-temperature sinterable ceramic particles and are then mixed together, thereby yielding a slurry. Subsequently, sheets are formed from this slurry on a carrier film by a doctor blade method and are then dried, whereby the base green sheets are formed.

As the low-temperature sinterable ceramic particles, a material forming glass during a sintering step, such as a mixture of barium oxide, silicon oxide, alumina, calcium oxide, and boron oxide, may be used. In addition, instead of the material described above, a mixture may be used which includes a ceramic used as filler, such as alumina, and glass used as an auxiliary agent for sintering, such as borosilicate glass or silicon oxide. As the low-temperature sinterable ceramic particles, any material may be used so long as a composition thereof is sinterable at about approximately 1,000° C. or less. However, in the case in which copper or nickel is used for the wiring conductor 5, it is necessary to select a ceramic composition which is not reduced during a sintering step performed in a reducing atmosphere.

As the organic binder, for example, an acrylic resin, polyvinyl butyral, or a methacrylic resin or other suitable material may be used.

As the solvent, for example, toluene, or an alcohol, such as isopropyl alcohol, or other suitable material may be used.

As the plasticizer, for example, di-n-butyl phthalate or other suitable material may be used.

The constraining green layer 12 contains the inorganic particle which is not sintered at a sintering temperature of the low-temperature sinterable ceramic particles described above, and as the inorganic particles, for example, powdered alumina or powdered zirconia may be used.

The constraining green layers 12 can be formed by steps of adding a plasticizer and an organic vehicle including an organic binder and a solvent to the inorganic particles described above, mixing the mixture thus obtained so as to form a slurry, coating the slurry on the base green sheets, and drying the slurry thus coated.

As the organic vehicle and the plasticizer contained in the constraining green layer 12, the same materials as those contained in the slurry used for forming the base green layers 11 may be used.

In addition, in order to form the constraining green layer 12, constraining green sheet may first be formed by using the slurry described above and may be placed over the base green sheet. Alternatively, constraining green sheet for forming the constraining green layer 12 may first be formed on a carrier film, and subsequently, the slurry containing the low-temperature sinterable ceramic material may be coated on the constraining green layer so as to form the base green layer 12.

In addition, in order to form the green laminate 2, a method may be used, including a so-called sequential coating step, which includes a step of preparing a base slurry for forming the base green layers 11 and a constraining slurry for forming the constraining green layers 12, a step of forming the base green layers 11 by, for example, coating the base slurry on a carrier film, and a step of coating the constraining slurry on the base green layers 11 for forming the constraining green layers 12.

The conductive paste bodies 13 for forming the wiring conductors 5 are preferably formed by using a conductive paste. The conductive paste preferably includes an organic vehicle and powdered metal used as a conductive material and is obtained preferably by stirring and kneading the ingredients mentioned above by, for example, using a shaking mill, or a three-roll mill or other suitable device.

As the metal used for the powdered metal for forming the conductive material described above, a metal may be used which withstands sintering conditions for the low-temperature sinterable ceramic material contained in the base green layer 11, and for example, a material may be advantageously used which is primarily composed of at least one metal selected from the group consisting of Ag, Au, Cu, Ni, Ag—Pd, and Ag—Pt.

The average particle diameter and the particle shape of the powdered metal are not specifically limited. However, the average particle diameter is preferably about 0.3 $\mu$m to about 10 $\mu$m, and no large particles and no excessively agglomerated particle are preferably contained.

As the organic vehicle contained in the conductive paste, a mixture may be used which includes a binder, such as ethyl cellulose, an alkyd resin, an acrylic resin, or a butyral resin, dissolved in an alcohol used as a solvent, such as terpineol, butyl carbitol, butyl carbitol acetate, and isopropyl alcohol.

In consideration of printing characteristics of the conductive paste, the viscosity thereof is preferably in a range of, for example, about 50 Pa·s to about 300 Pa·s.

In order to match the shrinkage of the conductive paste with that of the base green layer 11 during a sintering step, for example, approximately 70 percent by volume or less of a glass frit or a powdered ceramic may be contained in the conductive paste.

When the conductive paste bodies 13 are formed of the conductive paste described above, the conductive paste bodies 13 for forming the via hole conductors 8 and 9 are formed by a step of forming penetrating holes in predetermined base green layers 11 and also in the constraining green layers 12 when necessary, and a step of filling the conductive paste in the penetrating holes. The conductive paste bodies 13 for forming the conductive films 6 and 7 are formed by, for example, performing screen-printing of the conductive paste. In this printing step, the conductive paste may be filled in the penetrating holes described above.

The conductive paste bodies 13 for forming the conductive films 6 and 7 and the conductive paste bodies 13 for forming the via hole conductors 8 and 9 may be simultaneously formed as described above. However, in the case in which characteristics required for the conductive films 6 and 7 differ from those required for the via hole conductors 8 and 9, they may be formed in different steps by using different conductive pastes in which the particle sizes, the contents of the powdered metal contained in the individual conductive pastes, the organic vehicles, the viscosities, and the like are optimized, respectively.

The step of forming the conductive paste bodies 13 described above is performed before the base green sheets for forming the base green layers 11 are laminated with each other.

In addition, as described above, when the base green layers 11 and the constraining green layers 12 are formed by a so-called sequential coating step using the base slurry and the constraining slurry, a step of printing the conductive paste is performed each time the base slurry or the constraining slurry is coated. In the case described above, the coating areas of the slurries are determined so that the penetrating holes are formed in the steps of coating the slurries, which are to be located at which the conductive paste is provided for forming the via hole conductors 8 and 9.

The green laminate body 2 thus formed is then pressed in the laminated direction. In this connection, in the case in which the step of forming the green laminate 2 described above is a step of forming a mother type green laminate 2 which is subsequently divided so as to produce a plurality of monolithic ceramic substrates 1, a cutting step is performed after the pressing step to obtain a plurality of green laminate 2 for forming the monolithic ceramic substrates 1. The conductive paste bodies 13 for forming the terminal via hole conductors 9 are exposed at the side surfaces thereof in this cutting step. In addition, the cutting step may be performed by using a dicing saw after sintering in some cases.

In addition, at least parts of the conductive paste bodies 13 for forming the external conductive films 7 may be formed by printing the conductive paste after the pressing step described above is performed.

In addition to the conductive paste bodies including the conductive paste described above, the wiring conductors 5 provided for the monolithic ceramic substrate 1 may be formed of metal foils or metal wires. In the case described above, a method is performed in which a metal foil pouched out or a metal wire is provided on the base green layer 11 or on the constraining green layer 12 by hot pressing, or a method is performed by steps of forming a metal foil on an appropriate film by deposition, sputtering, plating, or other suitable process, patterning the metal foil by etching or other suitable process when required, and performing thermal transfer of the metal foil on the base green layer 11 or on the constraining green layer 12.

Next, the green laminate 2 is sintered under conditions causing sintering of the low-temperature sinterable ceramic particles, thereby yielding the monolithic ceramic substrate 1.

During the sintering step described above, the constraining green layers 12 themselves are not substantially shrunk. When the base green layers 11 are heated to a temperature at which glass is formed therein, or glass contained in the base green layer 11 is softened, a reaction layer approximately 2 $\mu$m to approximately 3 $\mu$m thick is formed at each interface of the constraining green layer 12 and the base green layer 11, and the reaction layer thus formed joins and adheres the constraining green layer 12 to the base green layer 11 adjacent thereto. As a result, the constraining green layers 12 are in the state having the constraining forces which can constrain the shrinkage of the base green layers 11 in the directions along the main surfaces thereof.

Accordingly, while the shrinkage of the base green layers 11 is constrained in the direction along the main surface thereof, the base green layers 11 are shrunk substantially in the thickness direction thereof since the low-temperature sinterable particles contained in the base green layers 11 is sintered, whereby the base ceramic layers 3 including the low-temperature sinterable ceramic material are formed to constitute the monolithic ceramic substrate 1. In addition, a part of the material, such as a glass component, contained in the base green layer 11 diffuses into the constraining green layer 12, whereby the inorganic particles are bonded, and the constraining green layer 12 is hardened.

However, the base green layers 11 forming the green laminate body 2 have different intrinsic shrinkabilities from each other during the sintering step.

That is, the base green layer 11($a$) is the thinnest, the base green layer 11($b$) has an intermediate thickness, and the base green layer 11($c$) is the thickest. When the thickness of the base green layer 11 described above is increased, the intrinsic shrinkability thereof becomes higher. Hence, the intrinsic shrinkability is increased in the order of the base green layer 11($a$), the base green layer 11($b$), and the base green layer 11($c$). Accordingly, unless an appropriate measure is taken, the green laminate 2 is warped during the sintering step, and as a result, the monolithic ceramic substrate 1 obtained by sintering is being warped.

In order to prevent the warping, the constraining forces of the constraining layers 12 which are applied to the base green layers 11 are made to differ from each other for constraining the shrinking thereof.

In particular, as shown in FIG. 2, the constraining green layer 12($a$) which is in contact with the main surface of the base green layer 11($a$) having a low shrinkability is preferably formed to be thin, the constraining green layer 12($b$) which is in contact with the main surface of the base green layer 11($b$) having an intermediate shrinkability is preferably formed to have an intermediate thickness, and the constraining green layer 12($c$) having a high shrinkability is preferably formed to be thick which is in contact with the main surface of the base green layer 11($c$).

The thickness of the constraining green layer 12 has an influence on the constraining force thereof, and when the thickness of the constraining green layer is increased, the constraining force thereof is increased which is applied to the base green layer 11. Accordingly, based on the relationship between the thickness and the constraining force, when the constraining forces of the constraining green layers 12 are respectively selected in accordance with the intrinsic shrinkabilities of the individual base green layers 11, the actual shrinking rates of the individual base green layers 11 in the sintering step can be made approximately equivalent to each other. As a result, the warping of the green laminate 2 can be prevented.

The method described above can be applied to a method for designing the monolithic ceramic substrate 1. That is, when the monolithic ceramic substrate 1 is designed, a method described below can be used.

First, a composite is prepared which is formed by laminating a first test green layer containing a low-temperature sinterable ceramic material and a second test green layer containing an inorganic particle. Next, a sintering step is performed for the composite under conditions causing sintering of the low-temperature sinterable ceramic material, and the shrinking rate of the first test green layer is measured in the direction along the main surface thereof. The steps described above are performed for various combinations of a plurality of first test green layers having thicknesses different from each other and a plurality of second test green layers having thicknesses different from each other, and as a result, the shrinking rates of various combinations of the first test green layers and the second test green layers can be preliminarily obtained.

Figure 3:
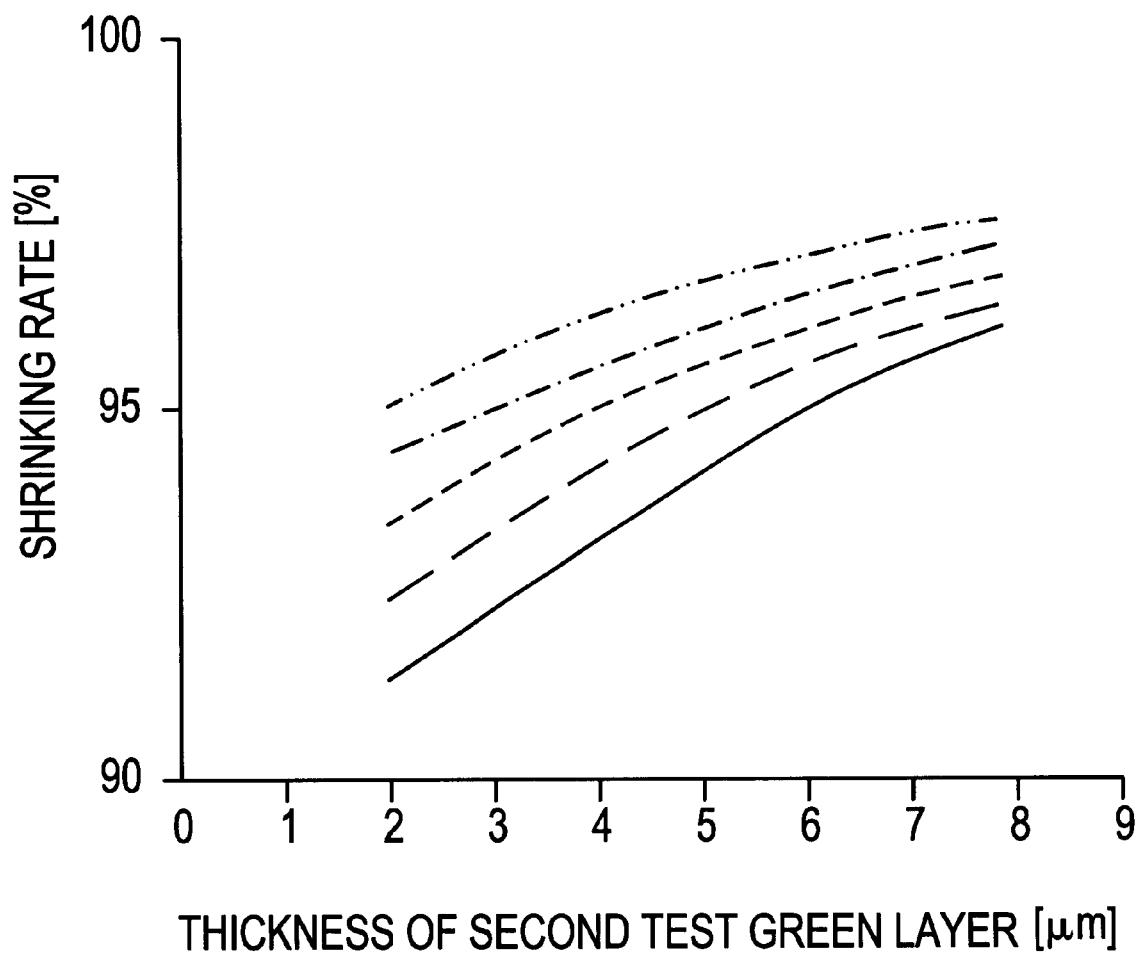
FIG. 3 is a graph showing shrinking rates during sintering of first test green layers in the direction along the main surfaces thereof, which are obtained from combinations of a plurality of types of first test green layers having different thicknesses from each other and a plurality of types of second green layers having different thicknesses from each other, in order to explain a method for designing a monolithic ceramic substrate according to various preferred embodiments of the present invention.

FIG. 3 is a graph showing the results of the shrinking rates of first test green layers in the direction along the main surface thereof, which are obtained from various combinations of a plurality of first test green layers having thicknesses different from each other and a plurality of second test green layers having thicknesses different from each other.

In the particular examples shown in FIG. 3, to a low-temperature sinterable ceramic material formed by mixing powdered barium oxide, silicon oxide, alumina, calcium oxide, and boron oxide, polyvinyl butyral as a binder, di-n-butyl phthalate as a plasticizer, and toluene and isopropyl alcohol as a solvent are added and are then mixed together for forming a slurry, and sheets are formed by a doctor blade method using the slurry and are then dried, whereby the first test green layers are formed.

In addition, the second test green layer is formed by steps of adding a binder, a plasticizer, and a solvent, which are equivalent to those described for the first test green layer, to powdered alumina having an average particle diameter of approximately 0.5 μm, mixing the mixture thus obtained to form a slurry, coating the slurry on the first test green layer, and drying the slurry thus coated.

In those steps described above, the first test green layers are preferably formed to have approximate thicknesses of 25 μm, 50 μm, 100 μm, and 300 μm, and test samples are formed which are composed of the second test green layers to have approximate thicknesses of 2 μm, 3 μm, 4 μm, 5 μm, 6 μm, 7 μm, and 8 μm each laminated with individual first test green layers described above.

Next, after these test samples are fired at approximately 900° C. for about 1 hour in a reducing atmosphere, the shrinking rates of the first test green layers are measured in the directions along the main surfaces thereof. The shrinking rates thus obtained are shown in FIG. 3.

After the data shown in FIG. 3 is obtained, first test green layers are preferably selected to have thicknesses that are substantially equivalent to those of a plurality of the base green layers 11 required for forming a desired monolithic ceramic substrate 1.

Next, combinations of the first test green layers and the second test green layers are selected, which have shrinking rates that are approximately equivalent to the shrinking rates of the individual first test green layers thus selected.

For example, when the shrinking rate is set to be about 95%, a first test green layer having a thickness of about 25 μm is laminated with a second test green layer that is about 2 μm thick, a first test green layer that is about 50 μm thick is laminated with a second test green layer that is about 3 μm thick, a first test green layer that is about 100 μm thick is laminated with a second test green layer that is about 4 μm thick, a first test green layer that is about 150 μm thick is laminated with a second test green layer that is about 5 μm thick, and a first test green layer that is about 300 μm thick is laminated with a second test green layer that is about 6 μm thick.

Next, the thicknesses of the constraining green layers 12 are determined so as to be substantially equivalent to those of the second test green layers of the combinations thus selected.

More particularly, in the green laminate 2 shown in FIG. 2, when the base green layer 11(a) is about 50 μm thick, the base green layer 11(b) is about 150 μm thick, and the base green layer 11(c) is about 300 μm thick, curves in FIG. 3 indicating first test green layers having thicknesses of about 50 μm, about 150 μm and about 300 μm, are referred, respectively.

Next, for example, when the shrinking rates of green layers are set to be about 95%, appropriate combinations are found which are a first test green layer that is about 50 μm thick with a second test green layer that is about 3 μm thick, a first test green layer that is about 150 μm thick with a second test green layer that is about 5 μm thick, and a first test green layer that is about 300 μm thick with a second test green layer that is about 6 μm thick.

Accordingly, the thicknesses of the constraining green layers 12 are preferably substantially equivalent to those of the second test green layers of the combinations. That is, the thickness of the constraining green layer 12(a) is preferably about 3 μm, the thickness of the constraining green layer 12(b) is preferably about 5 μm, and the thickness of the constraining green layer 12(c) is preferably about 6 μm.

When the monolithic ceramic substrate 1 is designed in accordance with the designing method described above, since the shrinking rates of the base green layers 11 during a sintering step are, for example, approximately 95%, warping of the green laminate 2 is preventing from occurring, and hence, warping of the completed monolithic ceramic substrate 1 is prevented.

In the preferred embodiments described above, in order to control the constraining forces of the constraining green layers 12, the thickness of the constraining green layers are preferably controlled. However, the control of the constraining forces can be performed by varying other factors.

For example, by changing the particle diameter of the inorganic particle contained in the constraining green layers 12, the constraining forces thereof can be controlled. Accordingly, as is the case with the control of the thickness of the constraining green layer 12 described above, the control of the particle diameters of the inorganic particle contained in the constraining green layers 12 can also be used for designing the monolithic ceramic substrate 1.

Figure 4:
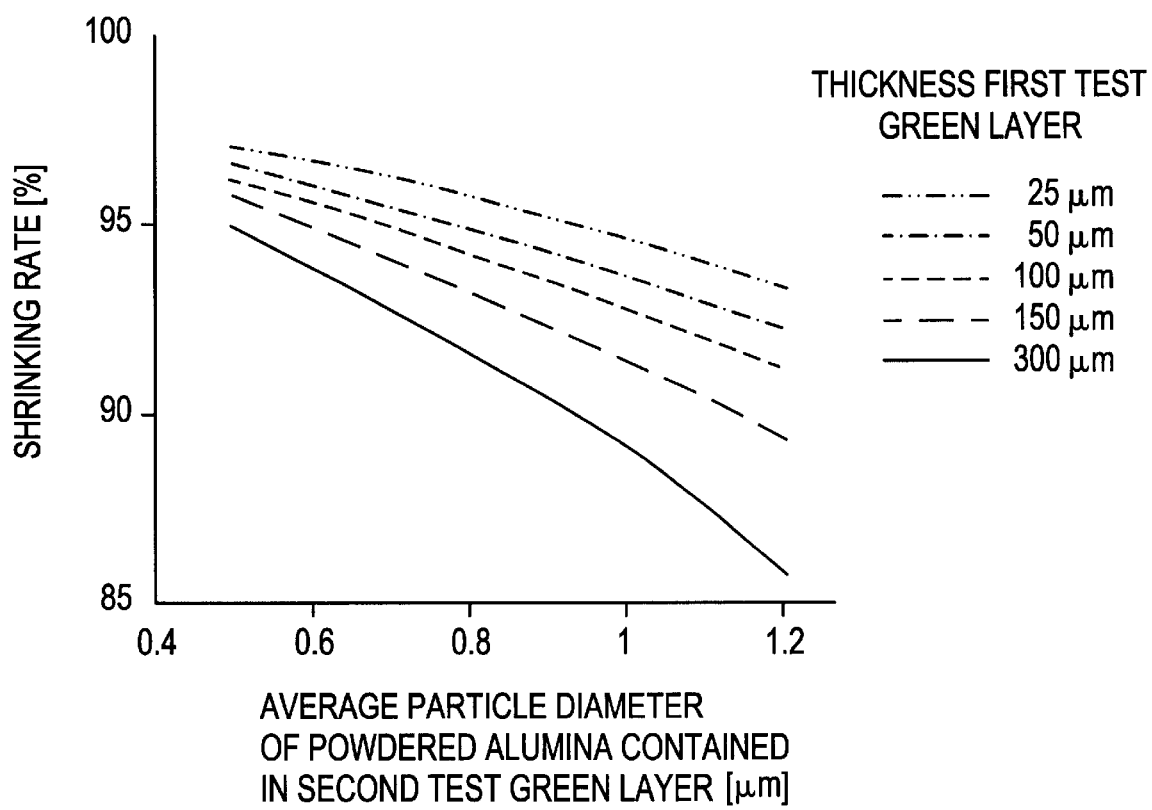
FIG. 4 is a graph showing shrinking rates of first test green layers in the direction along the main surfaces thereof during sintering, which are obtained from combinations of a plurality of types of first test green layers having different thicknesses from each other and a plurality of types of second green layers containing inorganic particles having different particle diameters from each other, in order to explain a method for designing a monolithic ceramic substrate according to various preferred embodiments of the present invention.

FIG. 4 is a graph corresponding to FIG. 3 and is a graph showing the results of the shrinking rates of first test green layers in the direction along the main surface thereof during a sintering step, obtained from various combinations of a plurality of first test green layers having different thicknesses and a plurality of second test green layers containing inorganic particles having average particle diameters that are different from each other.

The data shown in FIG. 4 is obtained by performing a procedure essentially equivalent to that for obtaining the data shown in FIG. 3 except that the second test green layer is fixed to have a thickness of approximately 6 μm.

As shown in FIG. 4, when the particle diameter of the inorganic particle contained in the second test green layer is smaller, the constraining force is increased, and it is understood that the shrinkage of the first test green layer is more unlikely to occur.

Accordingly, when the shrinking rate of the first test green layer is about 95%, it is found that a first test green layer that is approximately 25 μm thick may be laminated with a second test green layer containing an inorganic particle that has a particle diameter of about 1.0 μm, a first test green layer that is about 50 μm thick may be laminated with a second test green layer containing an inorganic particle that has a particle diameter of about 0.8 μm, a first test green layer that is about 100 μm thick may be laminated with a second test green layer containing an inorganic particle having a particle diameter of about 0.7 μm, a first test green layer that is about 150 μm thick may be laminated with a second test green layer containing an inorganic particle having a particle diameter of about 0.6 μm, and a first test green layer that is about 300 μm thick may be laminated with a second test green layer containing an inorganic particle having a particle diameter of about 0.5 μm.

Accordingly, when the particle diameter of the inorganic particle contained in the constraining green layer 12 is substantially equivalent to that of the inorganic particle contained in the second test green layer, warping is prevented from occurring during a sintering step.

By changing the type of inorganic particle contained in the constraining green layers 12, the constraining forces thereof can be controlled.

Figure 5:
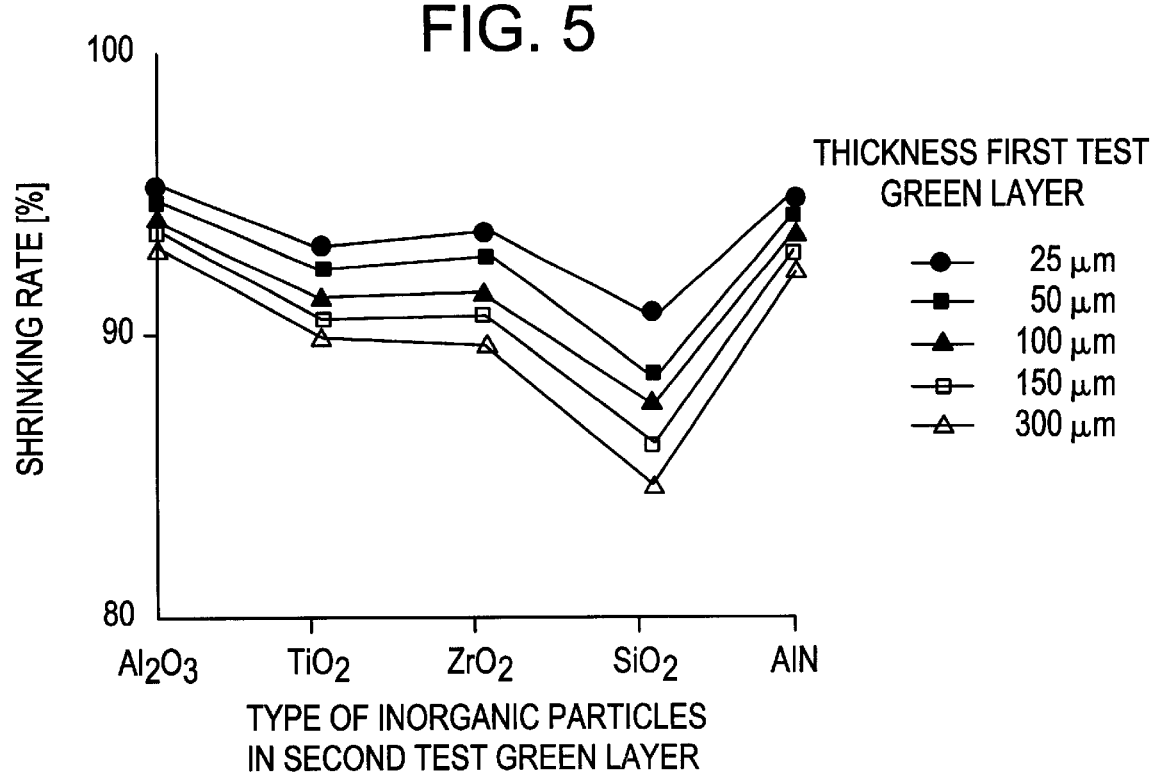
FIG. 5 is a graph showing shrinking rates of first test green layers in the direction along the main surfaces thereof during sintering, which are obtained from combinations of a plurality of types of first test green layers having different thicknesses from each other and a plurality of types of second green layers containing different types of inorganic particles from each other, in order to explain a method for designing a monolithic ceramic substrate according to various preferred embodiments of the present invention.

FIG. 5 is a graph corresponding to FIG. 3 and is a graph showing the results of the shrinking rates of first test green layers in the direction along the main surface thereof during a sintering step, obtained from various combinations of a plurality of first test green layers having different thicknesses and a plurality of second test green layers containing different types of inorganic particles.

The data shown in FIG. 5 is obtained by performing a procedure essentially equivalent to that for obtaining the data shown in FIGS. 3 and 4 except that the second test green layer is fixed to have a thickness of about 6 μm and that $Al_2O_3$, $TiO_2$, $ZrO_2$, $SiO_2$, and AlN are respectively used as the inorganic particle.

As shown in FIG. 5, by changing the type of inorganic material contained in the second test green layer, the constraining force thereof can be changed. Accordingly, in accordance with the data shown in FIG. 5, a plurality of types of first test green layers are selected to have thicknesses that are substantially equivalent to those of the base green layers 11 required for forming the monolithic ceramic substrate 1, combinations of the first test green layers and the second test green layers are then selected having shrinking rates approximately equivalent to those of the plurality of selected types of first test green layers, and constraining green layers 12 may contain inorganic particles that are substantially equivalent to those contained in the second test green layers of the combinations thus selected.

In addition, the constraining forces of the constraining green layers 12 can also be controlled by another factor other than the thickness of the constraining green layer 12, the particle diameter, and the type of inorganic particle contained in the constraining green layer 12.

For, example, the constraining force can also be controlled by changing the shape of the inorganic particle contained in the constraining green layer 12. For example, the constraining force can be controlled by using an inorganic particle having a substantially spherical shape, a flat shape, a needle shape, another irregular shape, or any combination thereof.

In addition, the constraining force can also be controlled by the particle distribution (board, narrow) and the content of the inorganic particle contained in the constraining green layer 12.

The constraining force can also be controlled by the surface condition (surface coating, degree of crystallization) of the inorganic particle contained in the constraining green layer 12.

Furthermore, the constraining force of the constraining green layer 12 may also be controlled by a combination of the various factors described above.

In preferred embodiments described above, the intrinsic shrinkability during a sintering step is varied by changing the thickness of the base green layer 11. However, the intrinsic shrinkability may also be varied by changing other characteristics of the base green layer 11 in some cases.

For example, the intrinsic shrinkage of the base green layer 11 may be influenced by the composition thereof. The shrinkability described above may be influenced by, for example, the type of low-temperature sinterable ceramic material contained in the base green layer 11, the ratio of the content thereof to that of the organic vehicle, the particle diameter of the low-temperature sinterable ceramic material, and other characteristics.

In addition, the shrinkability of the base green layer 11 may be influenced in some cases by the distribution or the wiring density distribution of the conductive paste body formed on the base green layer 11. For example, when the conductive paste film composed of the conductive paste body is formed over a wider area, the base green layer 11 is less likely to shrink.

Accordingly, when the monolithic ceramic substrate 1 is designed, in addition to the thickness of the base green layer 11, characteristics, such as the composition thereof, the distribution, and the wiring density distribution of the conductive paste body, are also taken into consideration.

In the preferred embodiments described above, a constraining green layer having a relatively strong constraining force is arranged so as to be in contact with a base green layer having a relatively high intrinsic shrinkability during a sintering step, and a constraining green layer having a relatively weak constraining force is arranged to be in contact with a base green layer having a relatively low intrinsic shrinkability during a sintering step. However, the disposition of the constraining green layers is not specifically limited. So long as the constraining green layers are arranged so as to prevent the occurrence of warping of the entire monolithic ceramic substrate, any disposition of the constraining layers may be accepted.

In addition, preferred embodiments of the present invention can also be applied to a monolithic ceramic substrate provided with cavities.

Examples will be described below which were performed in order to illustrate the advantages of preferred embodiments of the present invention.

Figure 6:
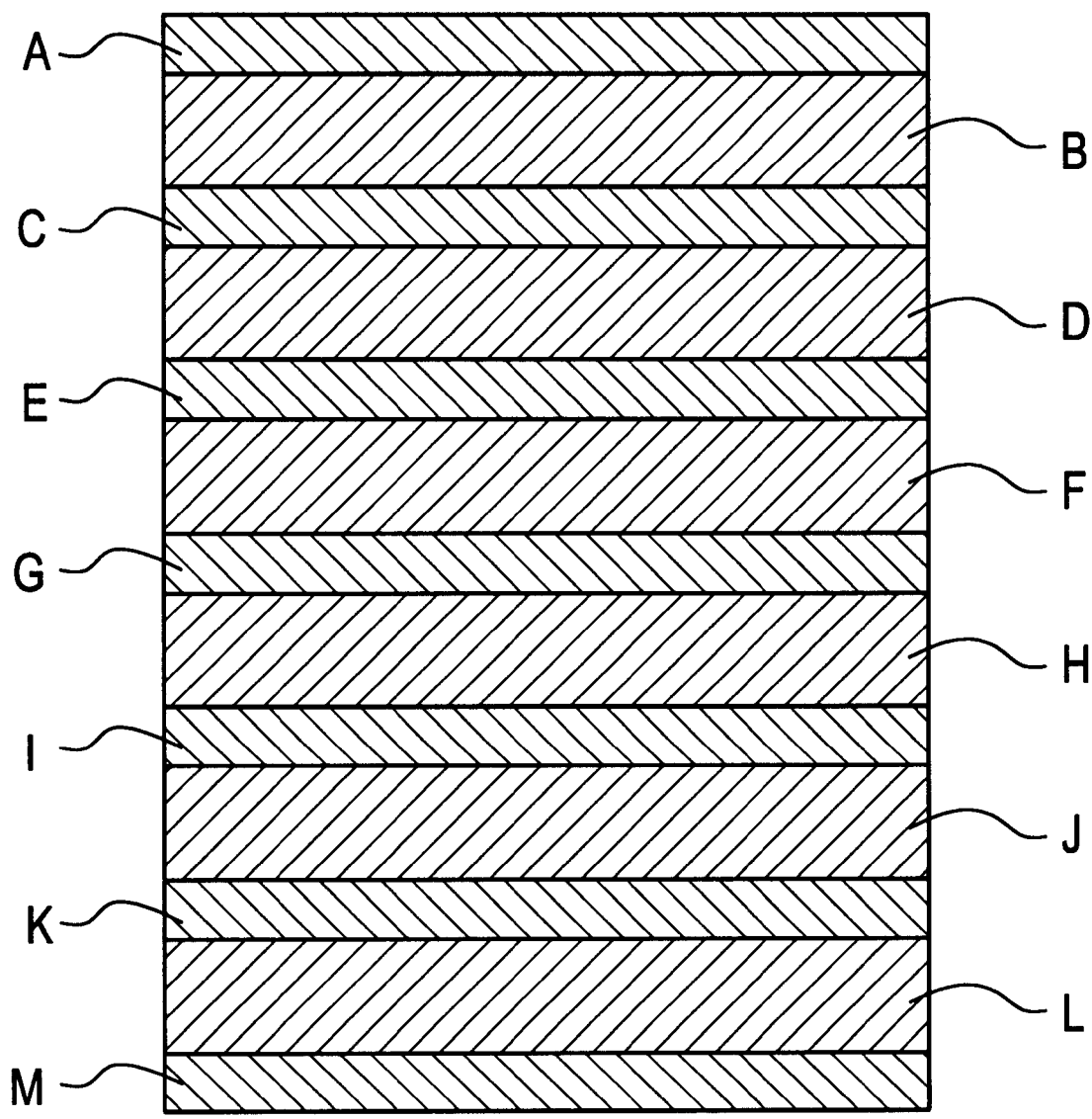
FIG. 6 is a schematic cross-sectional view showing a laminated structure of a green laminate according to an example performed in order to confirm the advantages of various preferred embodiments of the present invention.

In the first Example, a green laminate body as shown in FIG. 6 was formed. The green laminate body has a structure that was formed by laminating a plurality of base green layers B, D, F, H, J, and L and a plurality of constraining green layers A, C, E, G, I, K, and M, alternately.

As a green laminate having this laminated structure, green laminates of samples 1 to 9 shown in Tables 1 and 2 were formed.

TABLE 1

|  |  | Sample 1 | Sample 2 | Sample 3 | Sample 4 | Sample 5 |
| --- | --- | --- | --- | --- | --- | --- |
| A (Constraint) | Material | Alumina | Alumina | Alumina | None | Alumina |
|  | Particle Diameter/μm | 0.5 | 0.5 | 0.5 |  | 0.5 |
|  | Thickness/μm | 2 | 8 | 4 |  | 4 |
| B (Base) | Material | Ba—Al—Si—O—based | Ba—Al—Si—O—based | Ba—Al—Si—O—based | Ba—Al—Si—O—based | Ba—Al—Si—O—based |
|  | Particle Diameter/μm | 2 | 2 | 2 | 2 | 2 |
|  | Thickness/μm | 50 | 50 | 50 | 50 | 50 |

TABLE 1-continued

|   |   | Sample 1 | Sample 2 | Sample 3 | Sample 4 | Sample 5 |
|---|---|---|---|---|---|---|
| C (Constraint) | Material | Alumina | Alumina | Alumina | Alumina | Alumina |
|   | Particle Diameter/μm | 0.5 | 0.5 | 0.5 | 0.5 | 0.5 |
|   | Thickness/μm | 2 | 8 | 4 | 4 | 4 |
| D (Base) | Material | Ba—Al—Si—O— based | Ba—Al—Si—O— based | Ba—Al—Si—O— based | Ba—Al—Si—O— based | Ba—Al—Si—O— based |
|   | Particle Diameter/μm | 2 | 2 | 2 | 2 | 2 |
|   | Thickness/μm | 50 | 50 | 50 | 50 | 50 |
| E (Constraint) | Material | Alumina | Alumina | Alumina | Alumina | Alumina |
|   | Particle Diameter/μm | 0.5 | 0.5 | 0.5 | 0.5 | 0.5 |
|   | Thickness/μm | 2 | 8 | 4 | 4 | 4 |
| F (Base) | Material | Ba—Al—Si—O— based | Ba—Al—Si—O— based | Ba—Al—Si—O— based | Ba—Al—Si—O— based | Ba—Al—Si—O— based |
|   | Particle Diameter/μm | 2 | 2 | 2 | 2 | 2 |
|   | Thickness/μm | 150 | 150 | 150 | 150 | 150 |
| G (Constraint) | Material | Alumina | Alumina | Alumina | Alumina | None |
|   | Particle Diameter/μm | 0.5 | 0.5 | 0.5 | 0.5 |   |
|   | Thickness/μm | 2 | 8 | 6 | 6 |   |
| H (Base) | Material | Ba—Al—Si—O— based | Ba—Al—Si—O— based | Ba—Al—Si—O— based | Ba—Al—Si—O— based | Ba—Al—Si—O— based |
|   | Particle Diameter/μm | 2 | 2 | 2 | 2 | 2 |
|   | Thickness/μm | 150 | 150 | 150 | 150 | 150 |
| I (Constraint) | Material | Alumina | Alumina | Alumina | Alumina | Alumina |
|   | Particle Diameter/μm | 0.5 | 0.5 | 0.5 | 0.5 | 0.5 |
|   | Thickness/μm | 2 | 8 | 6 | 6 | 6 |
| J (Base) | Material | Ba—Al—Si—O— based | Ba—Al—Si—O— based | Ba—Al—Si—O— based | Ba—Al—Si—O— based | Ba—Al—Si—O— based |
|   | Particle Diameter/μm | 2 | 2 | 2 | 2 | 2 |
|   | Thickness/μm | 300 | 300 | 300 | 300 | 300 |
| K (Constraint) | Material | Alumina | Alumina | Alumina | Alumina | Alumina |
|   | Particle Diameter/μm | 0.5 | 0.5 | 0.5 | 0.5 | 0.5 |
|   | Thickness/μm | 2 | 8 | 8 | 8 | 8 |
| L (Base) | Material | Ba—Al—Si—O— based | Ba—Al—Si—O— based | Ba—Al—Si—O— based | Ba—Al—Si—O— based | Ba—Al—Si—O— based |
|   | Particle Diameter/μm | 2 | 2 | 2 | 2 | 2 |
|   | Thickness/μm | 300 | 300 | 300 | 300 | 300 |
| M (Constraint) | Material | Alumina | Alumina | Alumina | None | Alumina |
|   | Particle Diameter/μm | 0.5 | 0.5 | 0.5 |   | 0.5 |
|   | Thickness/μm | 2 | 8 | 8 |   | 8 |
|   | Warpage/μm | 1,300 | 210 | 28 | 74 | 33 |

TABLE 2

|   |   | Sample 6 | Sample 7 | Sample 8 | Sample 9 |
|---|---|---|---|---|---|
| A (Constraint) | Material | Alumina | Titania | Alumina | Alumina |
|   | Particle Diameter/μm | 1.2 | 0.5 | 0.5 | 0.5 |
|   | Thickness/μm | 6 | 6 | 2 | 2 |
| B (Base) | Material | Ba—Al—Si—O— based | Ba—Al—Si—O— based | Nd—Ti—Sr—O— based | Nd—Ti—Sr—O— based |
|   | Particle Diameter/μm | 2 | 2 | 2 | 2 |
|   | Thickness/μm | 50 | 50 | 50 | 50 |
| C (Constraint) | Material | Alumina | Titania | Alumina | Alumina |
|   | Particle Diameter/μm | 1.2 | 0.5 | 0.5 | 0.5 |
|   | Thickness/μm | 6 | 6 | 2 | 2 |
| D (Base) | Material | Ba—Al—Si—O— based | Ba—Al—Si—O— based | Nd—Ti—Sr—O— based | Nd—Ti—Sr—O— based |
|   | Particle Diameter/μm | 2 | 2 | 2 | 2 |
|   | Thickness/μm | 50 | 50 | 50 | 50 |

TABLE 2-continued

|   |   | Sample 6 | Sample 7 | Sample 8 | Sample 9 |
|---|---|---|---|---|---|
| E (Constraint) | Material | Alumina | Titania | Alumina | Alumina |
|  | Particle Diameter/μm | 1.2 | 0.5 | 0.5 | 0.5 |
|  | Thickness/μm | 6 | 6 | 2 | 2 |
| F (Base) | Material | Ba—Al—Si—O— based | Ba—Al—Si—O— based | Ba—Al—Si—O— based | Ba—Al—Si—O— based |
|  | Particle Diameter/μm | 2 | 2 | 2 | 2 |
|  | Thickness/μm | 150 | 150 | 50 | 50 |
| G (Constraint) | Material | Alumina | Aluminum Nitride | Alumina | Alumina |
|  | Particle Diameter/μm | 1 | 0.5 | 0.5 | 0.5 |
|  | Thickness/μm | 6 | 6 | 2 | 4 |
| H (Base) | Material | Ba—Al—Si—O— based | Ba—Al—Si—O— based | Ba—Al—Si—O— based | Ba—Al—Si—O— based |
|  | Particle Diameter/μm | 2 | 2 | 2 | 2 |
|  | Thickness/μm | 150 | 150 | 50 | 50 |
| I (Constraint) | Material | Alumina | Alumina | Alumina | Alumina |
|  | Particle Diameter/μm | 1 | 0.5 | 0.5 | 0.5 |
|  | Thickness/μm | 6 | 6 | 2 | 4 |
| J (Base) | Material | Ba—Al—Si—O— based | Ba—Al—Si—O— based | Ba—Al—Si—O— based | Ba—Al—Si—O— based |
|  | Particle Diameter/μm | 2 | 2 | 2 | 2 |
|  | Thickness/μm | 300 | 300 | 50 | 50 |
| K (Constraint) | Material | Alumina | Alumina | Alumina | Alumina |
|  | Particle Diameter/μm | 0.5 | 0.5 | 0.5 | 0.5 |
|  | Thickness/μm | 6 | 6 | 2 | 4 |
| L (Constraint) | Material | Ba—Al—Si—O— based | Ba—Al—Si—O— based | Ba—Al—Si—O— based | Ba—Al—Si—O— based |
|  | Particle Diameter/μm | 2 | 2 | 2 | 2 |
|  | Thickness/μm | 300 | 300 | 50 | 50 |
| M (Constraint) | Material | Alumina | Alumina | Alumina | Alumina |
|  | Particle Diameter/μm | 0.5 | 0.5 | 0.5 | 0.5 |
|  | Thickness/μm | 6 | 6 | 2 | 4 |
|  | Warpage/μm | 55 | 60 | 1,200 | 36 |

In Tables 1 and 2, for the individual base green layers B, D, F, H, J, and L, and for the individual constraining green layers A, C, E, G, I, K, and M, the types of low-temperature sinterable materials and inorganic materials contained in the layers mentioned above, the particle diameters of the low-temperature sinterable materials and the inorganic materials, and the thicknesses of these layers are respectively shown.

In the Tables, "None" in the columns for the samples 4 and 5 indicates that constraining green layer is not present.

In addition, concerning base green layers B, D, F, H, J, and L represented by "Ba-Al-Si-O-based", base green sheets for forming the base green layers were formed in a manner as described below. That is, a slurry was obtained by mixing predetermined amounts of polyvinyl butyral as a binder, di-n-butyl terephthalate as a plasticizer, and toluene and isopropyl alcohol as a solvent with a powdered ceramic (the average particle diameter is shown in Tables 1 and 2) preferably including barium oxide, aluminum oxide, silicon oxide, calcium oxide, and boron oxide. Next, the slurry was coated on a carrier film by a doctor blade method and was then dried, whereby the base green sheets having thickness shown in Tables 1 and 2 were obtained.

The base ceramic layer used as an insulator was formed by sintering the base green sheet, which had a small dielectric constant ($\epsilon=6$) and a high resistance ($>10^{14}$ Ω·cm).

In addition, concerning base green layers represented by "Nd-Ti-Sr-O-based", base green sheets for forming the base green layers were formed in a manner as described below. That is, a powdered ceramic (the average particle diameters is shown in Table 2) including strontium titanate partly replaced by neodymium was processed in a manner similar to that described above, thereby yielding a slurry. Next, in a manner similar to that described above, base green sheets having a thickness shown in Table 2 were formed.

The base ceramic layer used as a dielectric material was formed by sintering the base green sheet, which had a high dielectric constant ($\epsilon=50$) and a low temperature coefficient of capacitance (Tcc=±30).

In addition, in order to form the constraining green layers A, C, E, G, I, K, and M, powdered alumina, powdered aluminum nitride, and powdered titania were prepared which respectively had particle diameters shown in Tables 1 and 2, and constraining slurries primarily composed thereof were then formed.

Next, in order to form a green laminate shown in FIG. 6, a step of coating the constraining slurries having thicknesses shown in Tables 1 and 2 on the individual base green sheets described above and a step of laminating a plurality of base green sheets were performed.

The laminates of the samples 1 to 9 thus formed were pressed at about 800° C. and at approximately 200 kg/cm² and were then fired at about 900° C. for 1 hour in a reducing atmosphere.

The warpage of the sintered laminates of the samples 1 to 9 were measured. The measurement results of the warpage are shown in Tables 1 and 2.

Hereinafter, the samples 1 to 9 will be discussed, respectively.

(1) Sample 1

In sample 1, even though the thicknesses of the base green layers B to L differed from each other, the constraining green layers A to M had the same thickness and contained the same inorganic particle having the same particle diameter.

According to sample 1, the shrinkage of the base green layers B to L in the directions along the main surfaces thereof was constrained. However, since the base green layers F and H were thicker than the base green layers B and D, and the base green layers J and L were thicker than the base green layers F and H, shrinking forces were significantly stronger at the thicker layer side of the base green layers B to L, and hence, the shrinkabilities differed between the base green layers B to L, whereby the warping of the sintered laminate body was significant.

(2) Sample 2

In the sample 2, the thicknesses of the base green layers B to L differed from each other, as was the case with the sample 1, and the constraining green layers A to M had the same thickness and contained the same inorganic particle having the same particle diameter. However, the thicknesses of the constraining green layers A to M were approximately 8 $\mu$m, which were thicker than those in the sample 1.

Accordingly, the constraining force for constraining shrinkage was increased, and as a result, the difference in shrinkability was decreased between the base green layers B to L having different thicknesses, and in addition, the warpage of the sintered laminate could be reduced lower than that of the sintered laminate in the sample 1. However, the warping could not be satisfactory constrained.

In this connection, when the thicknesses of the constraining green layers A to M are increased, the sintered constraining layers become brittle, and the problem may arise in that the strength of the obtained laminate is decreased.

(3) Sample 3

In sample 3, as were the cases with the samples 1 and 2, even though the thicknesses of the base green layers B to L differed from each other, in accordance with the thickness of the base green layers B to L, the thicknesses of the constraining green layers A to M were each determined by the thickness of a base green layers adjacent thereto.

That is, the constraining green layers A, C, and E had a relatively small thickness of about 4 $\mu$m which were adjacent to the base green layers B and D having a relatively small thickness of about 50 $\mu$m, the constraining green layers G and I had an intermediate thickness of about 6 $\mu$m which were adjacent to the base green layers F and H having an intermediate thickness of about 150 $\mu$m, and the constraining green layers K and M had a relatively large thickness of about 8 $\mu$m which were adjacent to the base green layers J and L having a relatively large thickness of about 300 $\mu$m.

Consequently, the shrinking rates during sintering of the base green layers B to L were made to be approximately equivalent to each other, and hence, the warpage of the sintered laminate could be significantly reduced.

(4) Sample 4

Sample 4 was substantially equivalent to the sample 3 except that the constraining green layers A and M which were located on the two ends of the green laminate in the laminated direction were not formed, and hence, the base green layers B and L were exposed.

According to the sample 4, the shrinking rates of the base green layers B and L were particularly increased by omitting the constraining green layers A and M. However, since the same measure as that in the sample 3 was taken, the warpage of the sintered laminate was not so much increased.

(5) Sample 5

Sample 5 was substantially equivalent to sample 3 except that the constraining green layer G which was located at the center of the green laminate was not formed.

In the sample 5, even though the central constraining green layer G was omitted, the arrangements of the constraining green layers A to E and I to M were symmetric with respect to the central surface of the entire green laminate in the laminated direction, and hence, the warpage was not increased so much.

(6) Sample 6

In the sample 6, the thicknesses of the individual base green layers B to L were substantially equivalent to those of the samples 1 to 5 described above, and even though the thicknesses of the constraining green layers A to M were the same, the particle diameters of powdered alumina contained therein differed from each other.

When the particle diameter of powdered alumina is decreased, the constraining force can be increased. Accordingly, in the sample 6, the constraining green layers A, C, and E contained powdered alumina having a particle diameter of about 1.2 $\mu$m which were adjacent to the base green layers B and D having a relatively small thickness of about 50 $\mu$m, the constraining green layers G and I contained powdered alumina having a particle diameter of about 1 $\mu$m which were adjacent to the base green layers F and H having an intermediate thickness of about 150 $\mu$m, and the constraining green layers K and M contained powdered alumina having a particle diameter of about 0.5 $\mu$m which were adjacent to the base green layers J and L having a relatively large thickness of about 300 $\mu$m.

Consequently, the shrinking rates of the base green layers B to L were made to be approximately equivalent to each other, and hence, the warpage of the sintered laminate could be controlled to be relatively small.

(7) Sample 7

In sample 7, the thicknesses of the individual base green layers B to L were substantially equivalent to those of the samples 1 to 6 described above, and even though the thicknesses of the constraining green layers A to M were the same, and the particle diameters of inorganic particles contained therein were the same, the types of inorganic particles differed from each other.

Accordingly, powdered alumina as an inorganic particle was contained in the constraining green layers I, K, and M which required stronger constraining forces, powdered aluminum nitride was contained in the constraining green layer G which only required an intermediate constraining force, and powdered titania was contained in the constraining green layers A, C, and E which preferably had weaker constraining forces.

As described above, by changing the types of inorganic particles contained in the constraining green layers A to M, the warpage of the obtained laminate could be controlled to be small.

(8) Sample 8

Sample 8 was a laminate body including the base green layers F, H, J, and L containing a Ba-Al-Si-O-based powdered ceramic and the base green layers B and D containing a Nd-Ti-Sr-O-based powdered ceramic, in which the thicknesses thereof were the same.

When the particle diameters of these powdered ceramic were the same in the sample 8, the shrinkabilities during sintering of the base green layers B and D containing a Nd-Ti-Sr-O-based powdered ceramic were lower than those of the base green layers F, H, J, and L containing a Ba-Al-Si-O-based powdered ceramic.

Accordingly, in the case of the sample 8, when constraining green layers A to M were formed which had the same thickness and which contained the same inorganic particle having the same particle diameter, since the shrinkabilities during sintering of the base green layers B and D differed from those of the base green layers F to L, as described above, the significant warping of the sintered laminate occurred.

(9) Sample 9

Sample 9 was substantially equivalent to the green laminate of the sample 8 except that the thicknesses of the constraining green layers A to M differed from each other.

That is, the constraining green layers A, C, and E had a relatively small thickness of about 2 µm which were adjacent to the base green layers B and D containing a Nd-Ti-Sr-O-based ceramic each having a relatively low shrinkability, and the constraining green layers G, I, K, and M had a relatively large thickness of about 4 µm which were adjacent to the base green layers F, H, J, and L containing a Ba-Al-Si-O-based ceramic each having a relatively high shrinkability.

Consequently, the warpage of the sintered laminate could be controlled to be small.

As has been thus described, according to the method for manufacturing a monolithic ceramic substrate of various preferred embodiments of the present invention, even if the base green layers constituting the green laminate have different intrinsic shrinkabilities during sintering, since the constraining green layers have different constraining forces applied to the base green layers so that the warping of the laminate is constrained which is caused by the different shrinkabilities described above, the warping of the obtained monolithic ceramic substrate is prevented.

As a result, a compact monolithic ceramic substrate having a higher wiring density can be manufactured with high reliability.

In addition, according to preferred embodiments of the present invention, since warping can be constrained by differing the thicknesses, or the compositions of the base green layers constituting the green laminate, or by changing the distribution, or wiring density distribution of the wiring conductors, as described above, a degree of freedom can be increased for designing the thickness, the composition of the base ceramic layer, and the wiring conductor in a desired monolithic ceramic substrates, whereby various monolithic ceramic substrates can be provided without any problems.

Furthermore, in the method for manufacturing a monolithic ceramic substrate according to various preferred embodiments of the present invention, the constraining force of the constraining green layer can be easily controlled by at least one factor of the thickness of the constraining green layer, the particle diameter, the type, the shape, the particle distribution, the content of the inorganic particle contained in the constraining green layer, and the surface condition thereof.

In the method for designing a monolithic ceramic substrate according to various preferred embodiments of the present invention, the shrinking rates of the first test green layers during a sintering step are preliminarily obtained from the individual combinations of a plurality of types of first test green layers having different shrinkabilities during sintering and a plurality of types of second test green layers having different constraining forces during sintering, a plurality of types of first test green layers are selected having characteristics equivalent to those of a plurality of base green layers required for forming a desired monolithic ceramic substrate, combinations of first test green layers and second test green layers are selected having shrinking rates approximately equivalent to those of the plurality of selected types of first test green layers, and constraining green layers are then determined having characteristics equivalent to those of the second test green layers of the selected combinations. Accordingly, designing of monolithic ceramic substrates, which are difficult to warp, can be easily performed, and in addition, the changes in design of monolithic ceramic substrates can be quickly performed.

As described above, when the monolithic ceramic substrate according to preferred embodiments of the present invention is mounted on a mother board for constituting an electronic device, since the monolithic ceramic substrate is compact and has a higher wiring density, and the warping thereof is constrained, a compact electronic device having improved multifunctionality can be advantageously produced, and in addition, the reliability of connections between the monolithic ceramic substrate and the mother board of the electronic device and other elements can be improved.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A monolithic ceramic substrate, comprising:
    a plurality of base ceramic layers which include a low-temperature sinterable ceramic;
    a plurality of constraining layers which include inorganic particles that are not sintered at a sintering temperature of the low-temperature sinterable ceramic material and which are each disposed so as to be in contact with a main surface of a predetermined layer of the plurality of base ceramic layers, the inorganic particles being bonded by diffusion of a part of the low-temperature sinterable ceramic material contained in the base ceramic layer adjacent to the constraining layer; and
    wiring conductors provided for the base ceramic layers;
    wherein at least two constraining layers selected from the plurality of constraining layers have different constraining forces which are applied to base green layers for forming the base ceramic layers to constrain the shrinkage of the base green layers during sintering.

2. A monolithic ceramic substrate according to claim 1, wherein the plurality of base ceramic layers includes a relatively thick first base ceramic layer and a relatively thin second base ceramic layer, and the plurality of constraining layers includes a first constraining layer arranged so as to be in contact with the main surface of the first base ceramic layer and a second constraining layer arranged so as to be in contact with the main surface of the second base layer, in which the thickness of the first constraining layer is larger than that of the second constraining layer.

3. A monolithic ceramic substrate according to claim 1, wherein the plurality of base ceramic layers includes a relatively thick first base ceramic layer and a relatively thin second base ceramic layer, and the plurality of constraining layers includes a first constraining layer arranged so as to be in contact with the main surface of the first base ceramic layer and a second constraining layer arranged so as to be in contact with the main surface of the second base layer, in which the particle diameter of the inorganic particles contained in the first constraining layer is smaller than that of the inorganic particles contained in the second constraining layer.

4. A monolithic ceramic substrate according to claim 1, wherein the plurality of base ceramic layers includes a first and a second base ceramic layer having different thicknesses, and the plurality of constraining layers includes a first and a second constraining layer disposed so as to be in contact with the main surfaces of the first and the second base ceramic layers, respectively, in which the types of the inorganic particles contained in the first and the second constraining layers differ from each other.

5. A monolithic ceramic substrate according to claim 1, wherein the wiring conductors include a conductive material primarily composed of at least one metal selected from the group consisting of Ag, Au, Cu, Ni, Ag—Pd, and Ag—Pt.

6. A monolithic ceramic substrate according to claim 1, wherein the wiring conductors include a conductive film extending along the main surface of the base ceramic layer and a via hole conductor extending so as to penetrate the base ceramic layer.

7. An electronic device comprising a monolithic ceramic substrate according to claim 1 and a motherboard having the monolithic ceramic substrate mounted thereon.

* * * * *